United States Patent
Na et al.

(10) Patent No.: US 8,932,922 B2
(45) Date of Patent: Jan. 13, 2015

(54) METHOD OF FABRICATING SEMICONDUCTOR DEVICE HAVING DUAL GATE

(75) Inventors: Hoon-joo Na, Hwseong-si (KR); Yu-gyun Shin, Seongnam-si (KR); Hong-bae Park, Seoul (KR); Hag-ju Cho, Hwaseong-si (KR); Sug-hun Hong, Yongin-si (KR); Sang-jin Hyun, Suwon-si (KR); Hyung-seok Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/116,045

(22) Filed: May 26, 2011

(65) Prior Publication Data
US 2011/0223758 A1 Sep. 15, 2011

Related U.S. Application Data

(62) Division of application No. 12/580,302, filed on Oct. 16, 2009, now Pat. No. 7,972,950.

(30) Foreign Application Priority Data

Feb. 9, 2009 (KR) ........................ 10-2009-0010200

(51) Int. Cl.
*H01L 21/8238* (2006.01)
*H01L 29/51* (2006.01)
*H01L 21/28* (2006.01)

(52) U.S. Cl.
CPC ........ *H01L 29/517* (2013.01); *H01L 21/28185* (2013.01); *H01L 21/28194* (2013.01); *H01L 21/823842* (2013.01); *H01L 21/823857* (2013.01)

USPC ........... 438/216; 438/275; 438/591; 257/392; 257/411

(58) Field of Classification Search
USPC .......... 438/216, 275, 287, 591, 592; 257/391, 257/392, 406, 410, 411
See application file for complete search history.

(56) References Cited

U.S. PATENT DOCUMENTS 7,030,001 B2 4/2006 Adetutu et al.
7,084,024 B2 8/2006 Gluschenkov et al.
(Continued)

FOREIGN PATENT DOCUMENTS

KR 1020050045737 A 5/2005
KR 1020070078975 A 8/2007

OTHER PUBLICATIONS

Copel, M., 'Reaction of barium oxide threshold voltage tuning layers with SiO2 and HfO2/SiO2 gate dielectrics,' Apr. 2008, Applied Physics Letters, vol. 92, No. 15, pp. 152909.*

(Continued)

*Primary Examiner* — Fernando L Toledo
*Assistant Examiner* — Bryan Junge
(74) *Attorney, Agent, or Firm* — Volentine & Whitt, PLLC

(57) ABSTRACT

A method of fabricating a semiconductor device having a dual gate allows for the gates to have a wide variety of threshold voltages. The method includes forming a gate insulation layer, a first capping layer, and a barrier layer in the foregoing sequence across a first region and a second region on a substrate, exposing the gate insulation layer on the first region by removing the first capping layer and the barrier layer from the first region, forming a second capping layer on the gate insulation layer in the first region and on the barrier layer in the second region, and thermally processing the substrate on which the second capping layer is formed. The thermal processing causes material of the second capping layer to spread into the gate insulation layer in the first region and material of the first capping layer to spread into the gate insulation layer in the second region. Thus, devices having different threshold voltages can be formed in the first and second regions.

12 Claims, 7 Drawing Sheets

(56) References Cited

U.S. PATENT DOCUMENTS

| | | |
|---|---|---|
| 7,291,526 B2 | 11/2007 | Li |
| 7,504,700 B2 | 3/2009 | Zhu et al. |
| 7,601,577 B2 | 10/2009 | Chambers et al. |
| 8,034,678 B2 * | 10/2011 | Kobayashi .................. 438/199 |
| 2003/0180994 A1 | 9/2003 | Polishchuk et al. |
| 2006/0237803 A1 | 10/2006 | Zhu et al. |
| 2007/0048920 A1 | 3/2007 | Song et al. |
| 2008/0283929 A1 | 11/2008 | Nabatame |
| 2010/0197128 A1 * | 8/2010 | Schaeffer et al. ............. 438/591 |

OTHER PUBLICATIONS

T. Schram et al., "Novel process to pattern selectively dual dielectric capping layers using soft-mask only," Jun. 17-19, 2008, 2008 Symposium on VLSI Technology p. 44-45.

Ragnarsson, Lars-Ake et al, "Achieving conduction band-edge effective work functions by La2O3 capping hafnium silicates," Jun. 2007, IEEE Electron Device Letters, vol. 28 No. 6 p. 486-488.

* cited by examiner

METHOD OF FABRICATING SEMICONDUCTOR DEVICE HAVING DUAL GATE

CROSS-REFERENCE TO RELATED APPLICATIONS

This application is a divisional of application Ser. No. 12/580,302, filed Oct. 16, 2009, which claims the benefit of Korean Patent Application No. 10-2009-0010200, filed on Feb. 9, 2009, in the Korean Intellectual Property Office.

BACKGROUND

The present inventive concept relates to a method of fabricating a semiconductor device. More particularly, the present inventive concept relates to a method of fabricating a semiconductor device having a dual gate.

Generally, a gate of a semiconductor device, namely a transistor, includes a gate insulation layer disposed on a semiconductor substrate and a gate electrode disposed on the gate insulation layer. The gate insulation layer is usually a silicon oxide layer, and the gate electrode is usually a poly-silicon layer. However, the materials of the components of the gate affect the operating speed of the device, and there is always a demand for semiconductor devices which are smaller and operate at higher speeds. With such considerations in mind, a semiconductor device has been developed in which the gate insulation layer is made of a high-k material, and the gate electrode is made of a metal.

SUMMARY

The present inventive concept is directed towards a method of fabricating a semiconductor device having a dual gate wherein the method is relatively simple and yet allows for a large variety in the threshold voltages of the gates that make up the dual gate.

According to an aspect of the inventive concept, a method of fabricating a semiconductor device having a dual gate includes forming a gate insulation layer, a first capping layer, and a barrier layer in the foregoing sequence across a first region and a second region on a substrate, exposing the gate insulation layer on the first region by removing the first capping layer and the barrier layer from the first region, forming a second capping layer on the gate insulation layer in the first region and on the barrier layer in the second region, and thermally processing the substrate on which the second capping layer is formed. As a result of the thermal processing, material of the second capping layer spreads into the gate insulation layer in the first region, and material of the first capping layer spreads into the gate insulation layer in the second region. The method may be used in effect to reduce the threshold voltages of gates that would otherwise be formed in the first and second regions using conventional techniques.

BRIEF DESCRIPTION OF THE DRAWINGS

These and other aspects of the inventive concept will be more clearly understood from the following detailed description of preferred embodiments thereof made in conjunction with the accompanying drawings in which.

DETAILED DESCRIPTION OF THE EMBODIMENTS

Figure 1A:
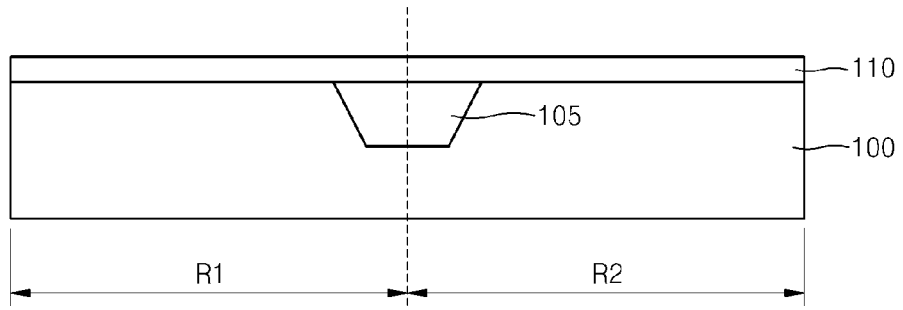
FIGS. 1A through 1F are cross-sectional views of a substrate and together illustrate one embodiment, of the present inventive concept, of a method of fabricating a semiconductor device having a dual gate.

Preferred embodiments of the present inventive concept will now be described more fully with reference to the accompanying drawings. Like numbers designate like elements throughout the drawings. Also, in the drawings, the thicknesses of layers and regions may be exaggerated for clarity.

A method of fabricating a complementary metal-oxide-semiconductor (CMOS) transistor having a dual gate, as an embodiment of the inventive concept, will now be described with reference to FIGS. 1A through 1F. However, as will be readily appreciated, the inventive concept is not limited to the fabricating of a CMOS transistor but may be applied to the fabricating of other types of semiconductor devices having dual gates.

Referring to FIG. 1A, a substrate 100 includes a first region R1 in which an n-type metal-oxide-semiconductor field-effect (NMOS) transistor is to be formed and a second region R2 in which a p-type metal-oxide-semiconductor field-effect (PMOS) transistor is to be formed. The substrate 100 may be, for example, a silicon, silicon-on-insulator, silicon-on-sapphire, germanium, silicon-germanium, or gallium-arsenide substrate. Furthermore, p-type wells may be situated in the first region R1, whereas n-type wells may be situated in the second region R2. The first region R1 and the second region R2 are demarcated by, for example, a device isolating layer 105. Hereinafter, though, reference characters R1 and R2 will simply be used to designate regions of the semiconductor device at which NMOS and PMOS transistors are to be formed, respectively.

A gate insulation layer 110 is formed on the substrate 100 using a (deposition) method such as atomic layer deposition (ALD) or chemical vapor deposition (CVD). The gate insulation layer 110 may be of a high-k material, such as hafnium oxide ($HfO_2$), hafnium silicon oxide (HfSiO), hafnium oxinitride (HfON), hafnium silicon oxinitride (HfSiON), hafnium aluminium oxide (HfAlO), hafnium lanthanum oxide (HfLaO), or lanthanum oxide ($La_2O_3$). Alternatively, the gate insulation layer 110 may be a dielectric material such as silicon oxide ($SiO_2$), silicon oxinitride (SiON), or silicon nitride (SiN). However, the gate insulation layer 110 is preferably of a high-k material because a gate insulation layer of a high-k material may be thinner than a gate insulation layer of silicon oxide. Thus, fabricating the gate insulation layer 110 of a high-k material facilitates the scaling down of the semiconductor device.

Figure 1B:
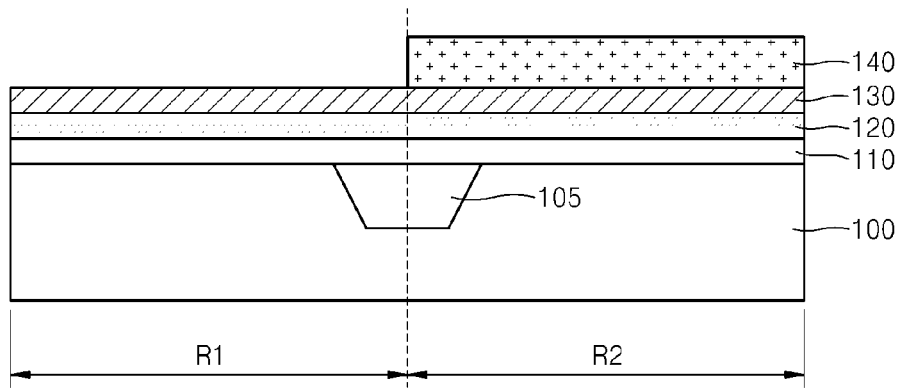

Referring to FIG. 1B, a first capping layer 120 is formed on the gate insulation layer 110. The first capping layer 120 comprises at least one material selected from the group consisting of aluminium oxide (AlO), lanthanum oxide (LaO), yttrium oxide (YO), dysprosium oxide (DyO), and magnesium oxide (MgO). According to an embodiment of the inventive concept, the first capping layer 120 is formed of AlO.

Next, a barrier layer 130 is formed on the first capping layer 120. More particularly, the barrier layer 130 is formed on the first capping layer 120 using a (deposition) method such as atomic layer deposition (ALD), chemical vapor deposition (CVD), or physical vapor deposition (PVD).

The barrier layer 130 comprises a metal or a metal alloy. For example, the barrier layer 130 may be formed of titanium (Ti), tantalum (Ta), tungsten (W), hafnium (Hf), molybdenum (Mo), a nitride thereof (e.g. TiN, TaN, WN, HfN, $Mo_2N$), a carbide thereof (e.g. TiC, TaC, WC, HfC, $Mo_2C$), a silicide thereof (e.g. $TiSi_2$, $WSi_2$, $TaSi_2$, $HfSi_2$, $MoSi_2$), or a silicide nitride thereof (TiSiN, WSiN, TaSiN, HfSiN, MoSiN). According to an embodiment of the inventive concept, the barrier layer 130 comprises a nitride of a metal, e.g., TiN or TaN.

Next, a mask layer 140 is formed on the barrier layer 130. The mask layer 140 may be either a soft mask, such as a photoresist, or a hard mask, such as an oxide. In any case, the mask layer 140 covers the barrier layer 130 in one of the first and second regions R1 and R2 and leaves the barrier layer 130 exposed in the other of the first and second regions R1 and R2. For example, as shown in FIG. 1B, the mask layer 140 exposes that part of the barrier layer 130 which lies in the first region R1, and covers that part of the barrier layer which lies in the second region R2.

Figure 1C:
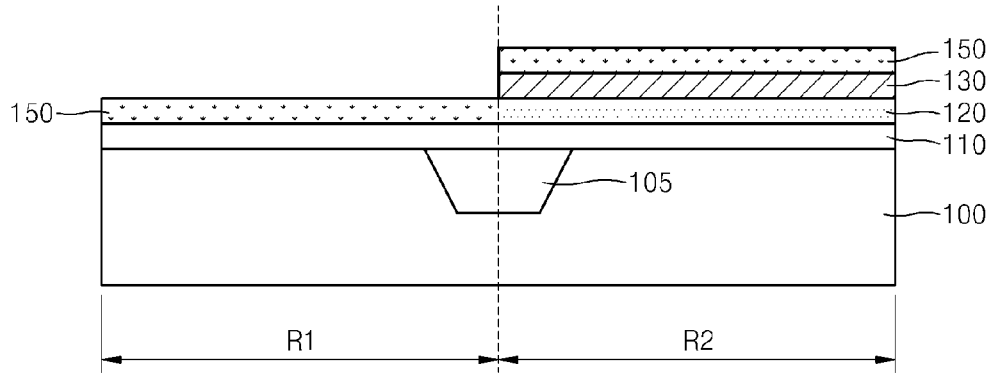

Referring to FIG. 1C, the barrier layer 130 and the first capping layer 120 are removed from the first region R1. Specifically, the barrier layer 130 and the first capping layer 120 are etched (dry-etched or wet-etched) using the mask layer 140 as an etching mask. Then the mask layer 140 is removed.

Next, a second capping layer 150 is formed on the gate insulation layer 110 in the first region R1 and on the barrier layer 130 in the second region R2. The second capping layer 150 may comprises at least one material selected from a group consisting of AlO, LaO, YO, DyO, and MgO. Preferably, the second capping layer 150 is formed of AlO, YO, DyO, or MgO. According to one aspect of the inventive concept, the second capping layer 150 is formed of a material different from that of the first capping layer 120.

Figure 1D:
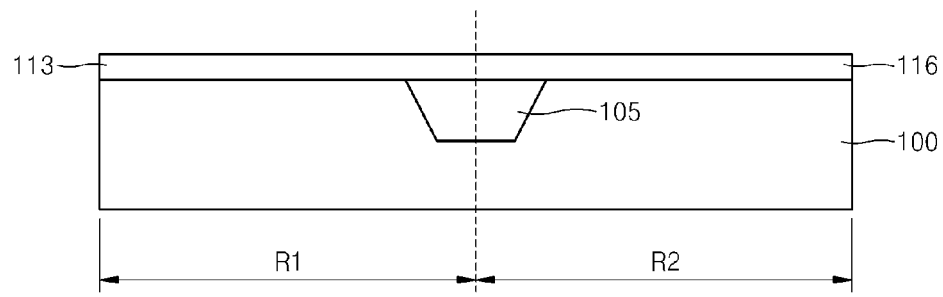

Referring to FIG. 1D, the substrate 100 on which the second capping layer 150 is formed is thermally processed. More specifically, the substrate 100 is thermally processed by a rapid thermal process (RTP) device or using a furnace. As a result, the gate insulation layer 110 and the second capping layer 150 react with each other in the first region R1 such that the material of the second capping layer 150 spreads into the gate insulation layer 110 in the first region R1. Accordingly, a first gate insulation layer 113 is formed in the first region R1. Furthermore, the gate insulation layer 110 and the first capping layer 120 react with each other in the second region R2 such that material of the first capping layer 120 spreads into the gate insulation layer 110 in the second region R2. Accordingly, a second gate insulation layer 116 is formed in the second region R2.

In this example, the barrier layer 130 functions as a blocking layer that prevents the material of the second capping layer 150 from spreading into the gate insulation layer 110 in the second region R2. Therefore, when the structure is thermally processed, only the material of the first capping layer 120 can spread into the gate insulation layer 110 in the second region R2 to form the second gate insulation layer 116. Meanwhile, the second capping layer 150 is disposed on the gate insulation layer 110 only in the first region R1. Therefore, material of the second capping layer 150 can spread into the gate insulation layer 110 in the first region R1, whereby the first gate insulation layer 113 is formed.

Next, the second capping layer 150 and the barrier layer 130 are removed from the substrate 100. Thus, the first gate insulation layer 113 formed on the first region R1 and the second gate insulation layer 116 formed on the second region R2 are substantially coplanar.

Figure 1E:
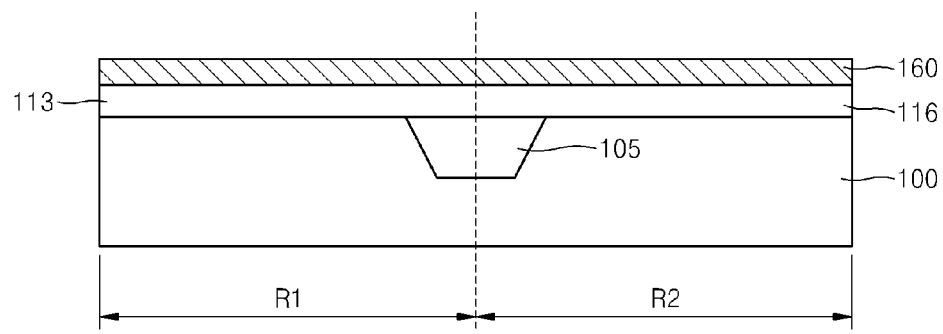

Referring to FIG. 1E, a gate electrode layer 160 is formed on the first and second gate insulation layers 113 and 116. In particular, the gate electrode layer 160 is formed on the first and second gate insulation layers 113 and 116 using a (deposition) method such as atomic layer deposition (ALD), chemical vapor deposition (CVD), or physical vapor deposition (PVD).

The gate electrode layer 160 comprises a metal or a metal alloy. For example, the gate electrode layer 160 is formed of Ti, Ta, W, Hf, Mo, a nitride thereof, a carbide thereof, a silicide thereof, or a silicide nitride thereof. According to an embodiment of the inventive concept, the gate electrode layer 160 is of a metal or a metal alloy, e.g., TiN or TaN. Such metals have resistance significantly lower than that of polysilicon or silicide. Therefore, this embodiment helps the semiconductor device to realize a relatively high operating speed. According to another aspect of the inventive concept, the gate electrode layer 160 is formed of a material different from that the barrier layer 130.

Figure 1F:
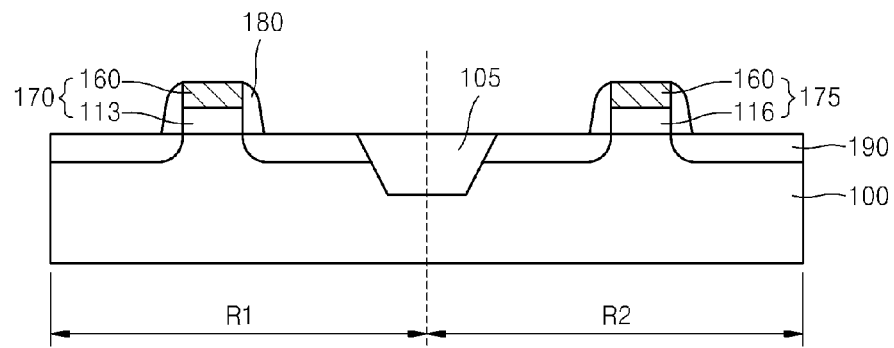

Referring to FIG. 1F, the gate electrode layer 160 and the first gate insulation layer 113 are patterned to form a first gate 170 in the first region R1, and the gate electrode layer 160 and the second gate insulation layer 116 are patterned to form a second gate 175 in the second region R2. Next, an insulation layer is formed on the substrate 100, and is etched by an etch-back process to form gate spacers 180 on the sides of the first and second gates 170 and 175.

According to another aspect of the inventive concept, a hard mask layer (not shown) may be formed on the gate electrode layer 160 (FIG. 1E). Then the hard mask layer, the gate electrode layer 160, and the first gate insulation layer 113 are patterned to form a first gate in region R1, and the hard mask layer, the gate electrode layer 160, and the second gate insulation layer 116 are patterned to form a second gate in region R2. Furthermore, the gate spacers 180 may be formed (in the manner described above) on the sides of such first and second gates.

Next, impurity regions 190 for a source and a drain are formed at opposite sides of the first gate 170 in the first region R1 and at opposite sides of the second gate 175 in the second region R2. The impurity regions 190 may comprise lightly doped drain (LDD) structures.

As described above, different gate insulation layers are formed in the first and second regions R1 and R2. In other words, a semiconductor device having a dual gate is realized, in which the gate electrode layers of the dual gates have identical compositions, but the gate insulation layers of the dual gates have different compositions. In other words, a semiconductor device having a dual dielectric-single metal dual gate can be realized.

According to the inventive concept, the composition of the gate insulation layer 110 is altered by the first and second capping layers 120 and 150, i.e., the compositions of the first and second gate insulation layers 113 and 116 can be formulated by selecting appropriate materials for the first and second capping layers 120 and 150. Thus, the first and second gates 170 and 175 may have work functions that are different from each other. More specifically, the gate of an NMOS transistor in region R1 may be fabricated to have a low threshold voltage by decreasing in the work function of the first gate during the fabrication thereof. Furthermore, the gate of the PMOS transistor in the second region R2 may be fabricated to have a low threshold voltage by increasing the work function of the second gate 175 during the fabrication thereof.

According to another aspect of the inventive concept, only one etching process or step is used in the sequence leading up to the forming of different gate insulation layers in the first and second regions R1 and R2. Thus, the method is relatively simple to carry out.

Furthermore, it is easy to incorporate/integrate the semiconductor device having a dual-gate, that is, a CMOS transistor, into/with another device because the first gate insulating layer 113 and the second gate insulation layer 116 are coplanar and hence, the gates can be made to have the same height.

FIGS. 2A through 2F show another embodiment, according to the inventive concept, of a method of fabricating a semiconductor device having a dual gate.

This embodiment will also be described as applied to a method of fabricating a CMOS transistor having a dual gate. However, as was mentioned above, the inventive concept is not so limited and may be applied to the fabricating of other forms of semiconductor devices having dual gates. Furthermore, the embodiment of FIGS. 2A through 2F is similar to that of FIGS. 1A through 1F; therefore, some portions of the method illustrated in FIGS. 2A through 2F which are similar to the portions of the method illustrated in FIGS. 1A through 1F will not be described in detail.

Figure 2A:
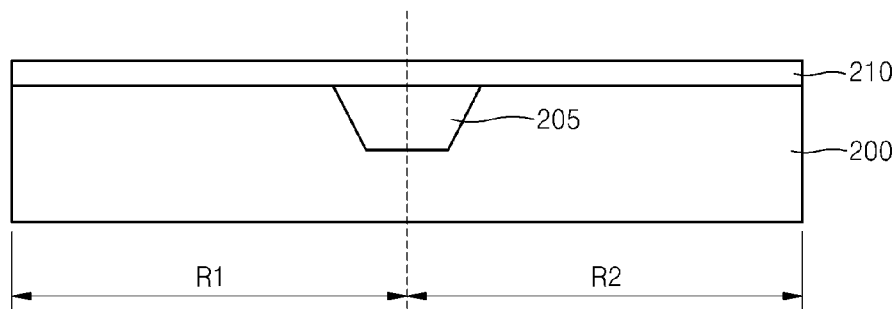
FIGS. 2A through 2F are cross-sectional views of a substrate and together illustrate another embodiment, of the present inventive concept, of a method of fabricating a semiconductor device having a dual gate.

Referring to FIG. 2A, a first region R1 in which a NMOS transistor is to be formed and a second region R2 in which a PMOS transistor is to be formed are demarcated on a substrate 200 by a device isolating layer 205. A gate insulation layer 210 is formed on the substrate 200.

Figure 2B:
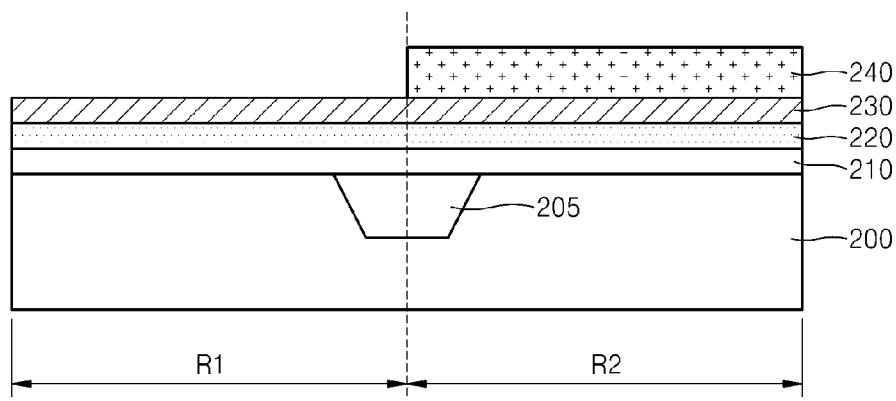

Referring to FIG. 2B, a first capping layer 220 is formed on the gate insulation layer 210. Next, a barrier layer 230 is formed on the first capping layer 220. Next, a mask layer 240 is formed on the barrier layer 230. The mask layer 240 exposes either the first region R1 or the second region R2.

Figure 2C:
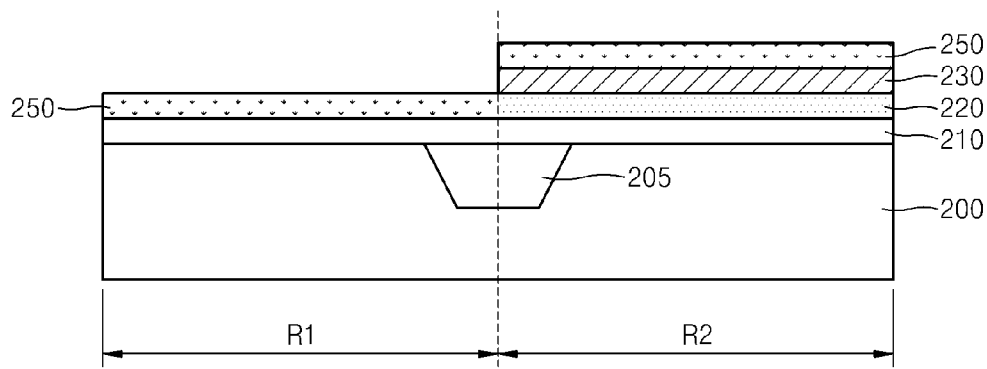

Referring to FIG. 2C, the barrier layer 230 and the first capping layer 220 are removed from the first region R1 by an etching process in which the mask layer 240 is used as an etch mask. Then, the mask layer 240 is removed. Next, a second capping layer 250 is formed on the gate insulation layer 210 in the first region R1 and on the barrier layer 230 in the second region R2.

Figure 2D:
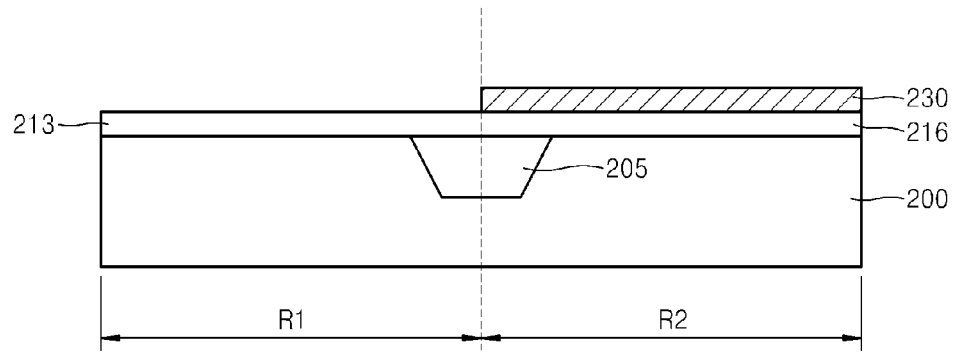

Referring to FIG. 2D, the substrate 200 on which the second capping layer 250 is formed is thermally processed. Therefore, the gate insulation layer 210 and the second capping layer 250 react with each other in the first region R1 such that material of the second capping layer 250 spreads into the gate insulation layer 210 in the first region R1. As a result, a first gate insulation layer 213 is formed. Furthermore, the gate insulation layer 210 and the first capping layer 220 react with each other in the second region R2 such that material in the first capping layer 220 spreads into the gate insulation layer 210 in the second region R2. As a result, a second gate insulation layer 216 is formed. During the thermal process, the barrier layer 230 functions as a blocking layer that prevents material of the second capping layer 250 from spreading into the gate insulation layer 210 in the second region R2. Next, the second capping layer 250 is removed from the substrate 200.

Figure 2E:
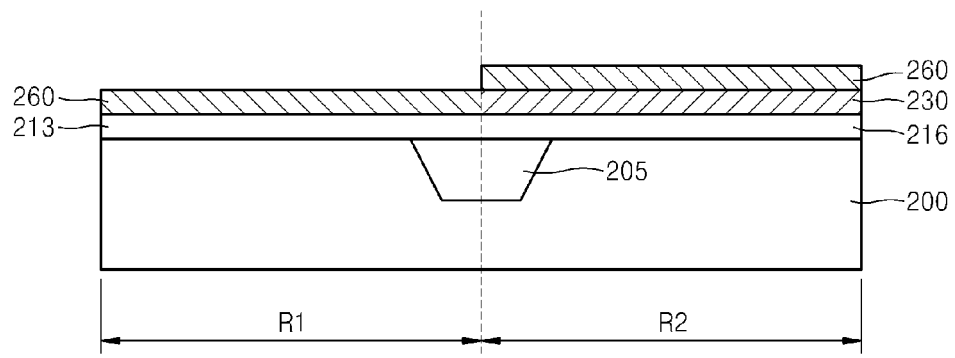

Referring to FIG. 2E, a gate electrode layer 260 is formed on the first gate insulation layer 213 in the first region R1 and on the barrier layer 230 in the second region R2. According to an embodiment of the inventive concept, the gate electrode layer 260 and the barrier layer 230 are formed of the same material. However, the gate electrode layer 260 may be formed of a material different from that of the barrier layer 230.

In any case, the barrier layer 230 and the gate electrode layer 260 are formed in the second region R2, but only the gate electrode layer 260 is formed in the first region R1. Thus, both the barrier layer 230 and the gate electrode layer 260 function as a gate electrode in the second region R2. Therefore, the thickness of the gate electrode formed in the second region R2 is greater than that of the gate electrode formed in the first region R1.

Figure 2F:
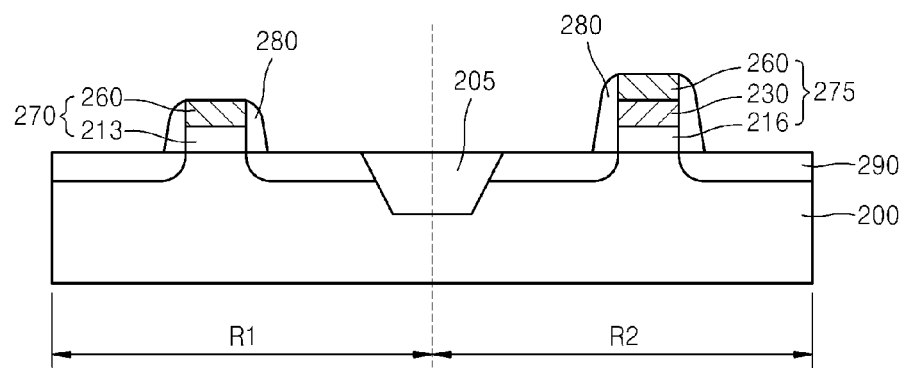

Referring to FIG. 2F, a first gate 270 is formed by patterning the gate electrode layer 260 and the first gate insulation layer 213 in the first region R1, and a second gate 275 is formed by patterning the gate electrode layer 260, the barrier layer 230, and the second gate insulation layer 216 in the second region R2. Furthermore, gate spacers 280 are formed on sides of the first and second gates 270 and 275 by forming an insulation layer on the substrate 200 and subjecting the insulating layer to an etch-back process.

According to another embodiment of the inventive concept, a hard mask layer (not shown) is formed on the gate electrode layer 260 (FIG. 2E). Then, a first gate is formed by patterning the hard mask layer, the gate electrode layer 260, and the first gate insulation layer 213 in the first region R1, and a second gate is formed by patterning the hard mask layer, the gate electrode layer 260, the barrier layer 230, and the second gate insulation layer 216 in the second region R2. Furthermore, the gate spacers 180 may be formed on the sides of such first and second gates in the manner described above.

Next, impurity regions 290 for a source and a drain are formed at opposite sides of the first gate 270 in the first region R1 and at opposite sides of the second gate 275 in the second region R2. The impurity regions 290 may comprise LDD structures.

As described above, the gate insulation layers formed in the first region R1 and in the second region R2, respectively, have different compositions. Furthermore, the barrier layer 230 is not removed from the second region R2. Thus, gates of different metals may be formed in the first and second regions R1 and R2.

More specifically, in semiconductor devices, fabricated according to the inventive concept, such the barrier layer 230 and the gate electrode layer 260 are of the same material, the first gate 270 and the second gate 275 have the same composition but different thicknesses. On the other hand, in semiconductor devices, fabricated according to the inventive concept, such that the barrier layer 230 and the gate electrode layer 260 have different compositions, the compositions and the thicknesses of the first gate 270 and the second gate 275 differ from each other. In other words, the semiconductor device has a dual gate in which gate electrode layers have different compositions or thicknesses from each other and the gate insulation layers have different compositions from each other. For example, in an embodiment of a CMOS transistor fabricated according to the inventive concept, an NMOS transistor and a PMOS transistor have different gate electrode thicknesses (or different gate electrode compositions and thicknesses) and have different gate insulation layer compositions.

In this respect, the composition of the first and second gate insulation layers 213 and 216 can be formulated according to the materials selected for the first and second capping layers 220 and 250. Thus, the work functions of the first and second gates 270 and 275 can be made to be different from each other. Furthermore, the barrier layer 230 in the second region R2 is not removed. Thus, the gate electrodes in the first region R1 and the second region R2 have different thicknesses. More specifically, a low threshold voltage of the gate of the NMOS transistor in region R1 may be established by decreasing the work function of the first gate 170 during the fabrication thereof. Furthermore, a low threshold voltage of the gate of the PMOS transistor in the second region R2 may be established by increasing the work function of the second gate 175 during the fabrication thereof.

FIGS. 3A through 3F illustrate another embodiment, according to the present inventive concept, of a method of fabricating a semiconductor device having a dual gate.

This embodiment will also be described as applied to a method of fabricating a CMOS transistor having a dual gate. However, again, the inventive concept is not so limited and may be applied to the fabricating of other forms of semiconductor devices having dual gates. Furthermore, the embodiment of FIGS. 3A through 3F is similar to those of FIGS. 1A through 1F and FIGS. 2A through 2F; therefore, some portions of the method illustrated in FIGS. 3A through 3F will not be described in detail and instead, reference may be made to the descriptions of the methods illustrated in FIGS. 1A through 1F and FIGS. 2A through 2F.

Figure 3A:
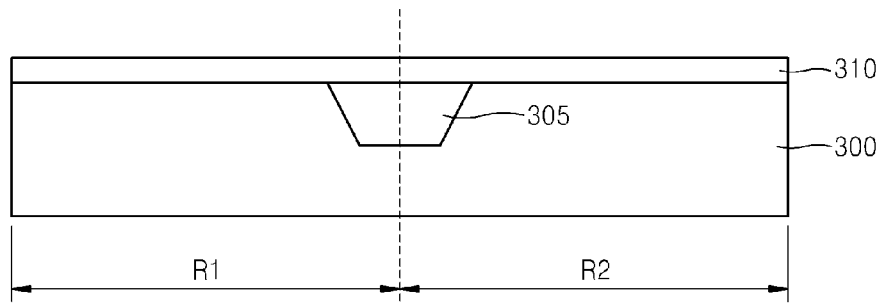
FIGS. 3A through 3F are cross-sectional views of a substrate and together illustrate still another embodiment, of the present inventive concept, of method of fabricating a semiconductor device having a dual gate.

Referring to FIG. 3A, a first region R1 in which a NMOS transistor is to be formed and a second region R2 in which a PMOS transistor is to be formed are demarcated on a substrate 300 by a device isolating layer 305. A gate insulation layer 310 is formed on the substrate 300.

Figure 3B:
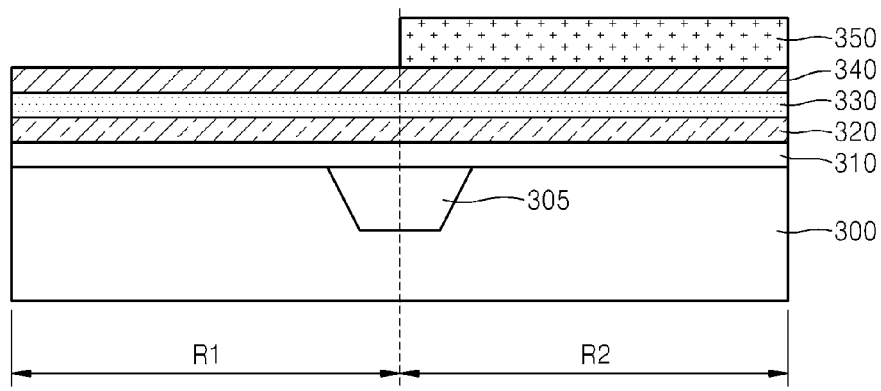

Referring to FIG. 3B, a metal layer 320 is formed on the gate insulation layer 310. Next, a first capping layer 330 is formed on the metal layer 320, a barrier layer 340 is formed on the first capping layer 330, and a mask layer 350 is formed on the barrier layer 340. More specifically, the mask layer 350 covers the barrier layer 340 in one of the first and second regions R1 and R2 (region R2 in this example) and exposes the barrier layer 340 is in the other of the first and second regions R1 and R2 (region R1 in this example). The metal layer 320 between the gate insulation layer 310 and the first capping layer 330 allows the first capping layer 330 to be subsequently easily removed from a portion of the gate insulation layer 310 (a process described below), especially when the gate insulation layer 310 and the first capping layer 330 are both oxide layers.

Figure 3C:
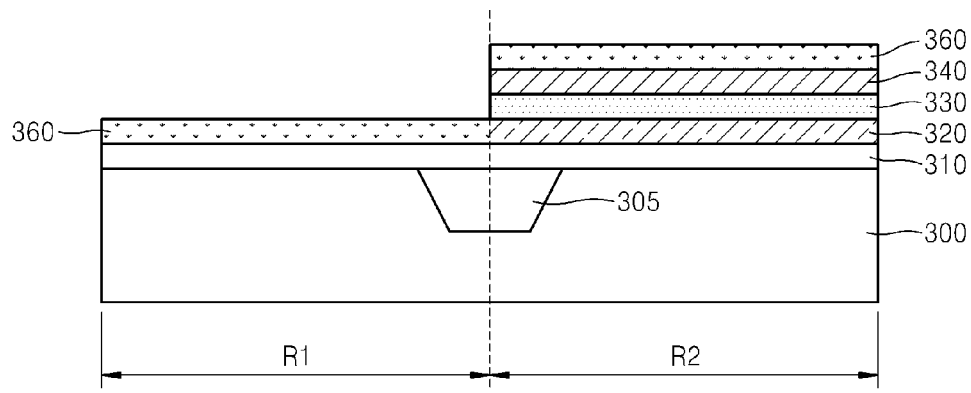

Referring to FIG. 3C, the barrier layer 340 and the first capping layer 330 are removed from the substrate 300 in the first region R1. Then, the mask layer 350 is removed. Next, a second capping layer 360 is formed on the gate insulation layer 310 in the first region R1 and on the barrier layer 340 in the second region R2.

Figure 3D:
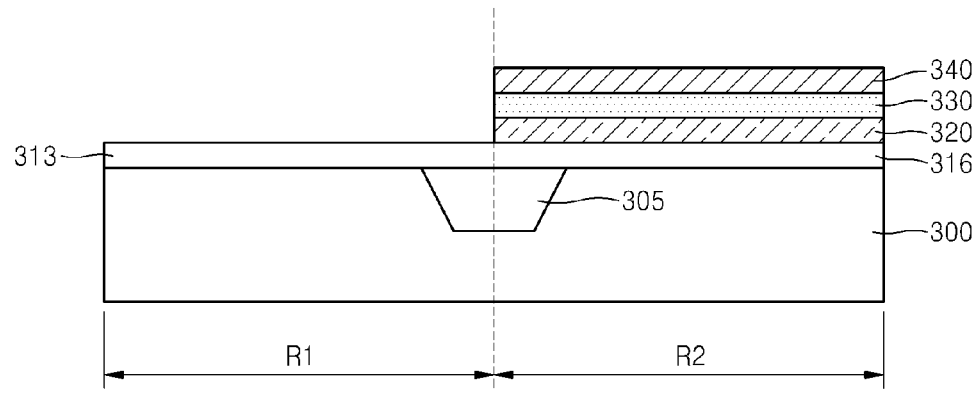

Referring to FIG. 3D, the substrate 300 on which the second capping layer 360 is formed is thermally processed such that the gate insulation layer 310 and the second capping layer 360 react with each other in the first region R1. Thus, material of the second capping layer 360 spreads into the gate insulation layer 310 in the first region R1. Accordingly, a first gate insulation layer 313 is formed. Furthermore, the gate insulation layer 310 and the first capping layer 330 react with each other in the second region R2 such that material of the first capping layer 330 spreads into the gate insulation layer 310 in the second region R2. Accordingly, a second gate insulation layer 316 is formed.

In this embodiment, the barrier layer 340 functions as a blocking layer that prevents the material of the second capping layer 360 from spreading into the gate insulation layer 310 in the second region R2. Furthermore, the metal layer 320 formed in the second region R2 may comprise a low density metal and may be so thin that material of the first capping layer 330 can spread into the gate insulation layer 310.

Next, the second capping layer 360 is removed from the substrate 300. According to another embodiment of the inventive concept, both the second capping layer 360 and the barrier layer 340 are removed from the substrate 300.

Figure 3E:
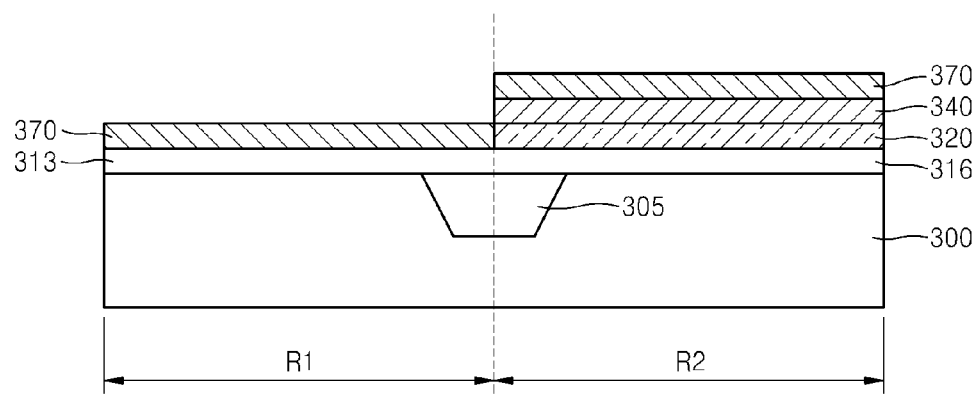

Referring to FIG. 3E, a gate electrode layer 370 is formed on the first gate insulation layer 313 in the first region R1 and on the barrier layer 340 in the second region R2. According to an embodiment of the inventive concept, the gate electrode layer 370 and the barrier layer 340 are formed of the same material. However, in other embodiments, the gate electrode layer 370 may be formed of a material different from that of the barrier layer 340.

Figure 3F:
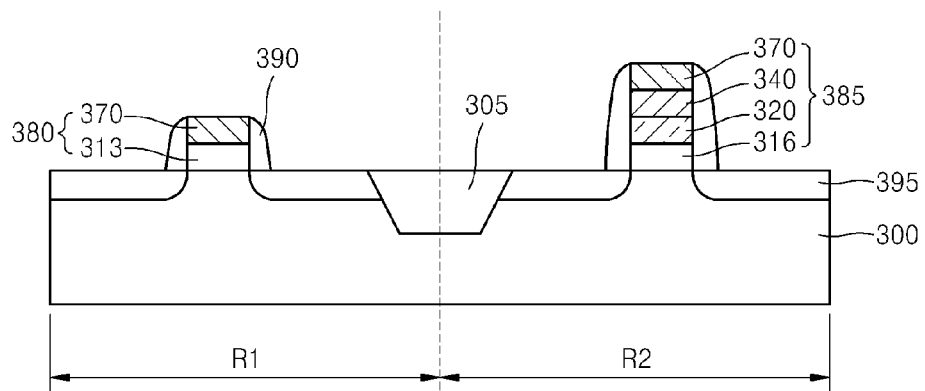

Referring to FIG. 3F, a first gate 380 is formed by patterning the gate electrode layer 370 and the first gate insulation layer 313 in the first region R1, and a second gate 385 is formed by patterning the gate electrode layer 370, the barrier layer 340, the metal layer 320, and the second gate insulation layer 316 in the second region R2. Furthermore, an insulation layer is then formed on the substrate 300, and is etched by an etch-back process to thereby form gate spacers 390 on the sides of the first and second gates 380 and 385.

According to another embodiment of the inventive concept, a hard mask layer (not shown) is formed on the gate electrode layer 370 (FIG. 3E). Then, a first gate is formed by patterning the hard mask layer, the gate electrode layer 370, and the first gate insulation layer 313 in the first region R1, and a second gate is formed by patterning the hard mask layer, the gate electrode layer 370, the barrier layer 340, the metal layer 320, and the second gate insulation layer 316 in the second region R2. Furthermore, the gate spacers 390 may be formed on the sides of such first and second gates in the manner described above.

Next, impurity regions 395 for a source and a drain are formed at opposite sides of the first gate 380 in the first region R1 and at two opposite sides of the second gate 385 in the second region R2, respectively. The impurity region 395 may comprise LDD structures.

As described above, a semiconductor device fabricated according to the embodiment of FIGS. 3A through 3F includes the metal layer 320 between the gate insulation layer 310 and the first capping layer 330. Therefore, a reaction between the gate insulation layer 310 and the first capping layer 330 can be prevented. Thus, not only does it become easy to remove the first capping layer 330 from the first region R1, but also only material of the second capping layer 360 can spread into the gate insulation layer 310 in the first region R1.

Furthermore, the provision of the barrier layer 340 allows different gate insulation layers to be formed in the first and second regions R1 and R2. The barrier layer 340 is not removed, though. Thus, gate electrodes having different structures can be formed on the first and second regions R1 and R2. In particular, in cases in which the barrier layer 340 and the gate electrode layer 370 have the same composition, the gate electrodes of the first gate 380 and the second gate 385 will have the same composition but different thicknesses. On the other hand, in cases in which the barrier layer 340 and the gate electrode layer 370 have different compositions, the compositions and the thicknesses of the gate electrodes of the first gate 380 and the second gate 385 will be different from each other.

In other words, the semiconductor device has a dual gate in which the gate electrodes have different thicknesses (and possibly different compositions as well) and the gate insulation layers have different compositions. Thus, the semiconductor device may have a dual dielectric-dual metal dual gate. For example, in a CMOS transistor embodied according to the inventive concept, an NMOS transistor and a PMOS transistor have different gate electrode layers in terms of their thickness/composition and have different gate insulation layers in terms of their composition.

Also, as described above, the composition of the original gate insulation layer 310 is changed in correspondence with the materials of the first and second capping layers 330 and 360. Furthermore, the barrier layer 340 remains in the second region R2 of the semiconductor device. Therefore, the thicknesses or configurations of the gate electrodes in the first and second regions R1 and R2 will be different. Thus, the first and second gates 380 and 385 may have different work functions. More specifically, the gate of an NMOS transistor in region R1 may be fabricated to have a low threshold voltage by decreasing in the work function of the first gate during the fabrication thereof. Furthermore, the gate of the PMOS transistor in the second region R2 may be fabricated to have a low threshold voltage by increasing the work function of the second gate 175 during the fabrication thereof.

Figure 4:
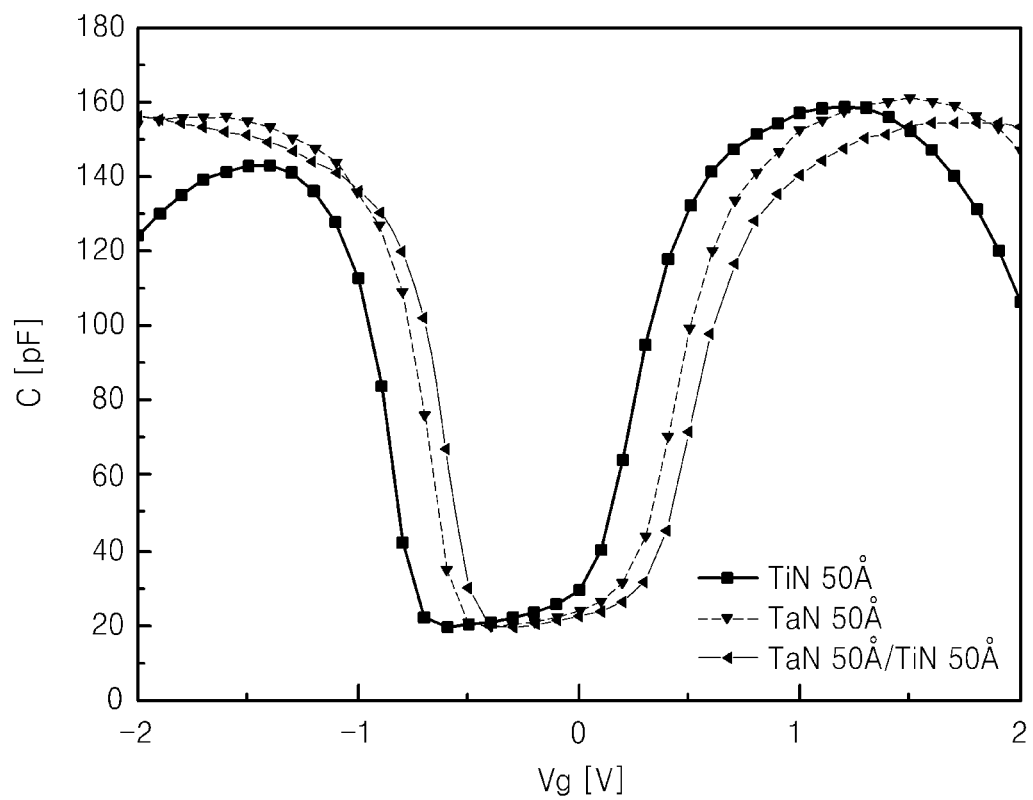
FIG. 4 is a graph of a voltage profiles for each of several gate electrodes, of different materials from one another, when employed in a semiconductor device having a dual gate fabricated according to the inventive concept.

FIG. 4 is a graph of voltages of different types of gates. The graph shows that the effective work function of a gate varies significantly according to changes in composition (type of metal) and thickness of a gate electrode.

More specifically, in the graph of FIG. 4, gate voltages Vg, that is, flat band voltages in volts (V), are plotted along the horizontal axis, whereas capacitances C in pico farads (pF) are plotted along the vertical axis. Also, in FIG. 4, the plot made up of the symbols —■— is for a case in which the gate electrode is a layer of TiN having a thickness of 50 Å, the plot made up of the symbols —▼— is for a case which the gate electrode is a layer of TaN having a thickness of 50 Å, and the plot made up of the symbols —◀— is for a case in which the gate electrode is a stacked structure of a layer of TaN having a thickness of 50 Å and a layer of TiN having a thickness of 50 Å.

First, as can be seen from FIG. 4, the flat band voltage of a gate electrode of a layer of TaN is approximately 180 mV greater than the flat band voltage of a gate electrode of a layer of TiN. Furthermore, the flat band voltage of a gate electrode of a stacked structure of TaN and TiN is approximately 90 mV greater than the flat band voltage of a gate electrode of TaN.

Assume for the moment that in the embodiment illustrated in FIGS. 2A through 2F, the barrier layer 230 is a layer of TaN having a thickness of 50 Å, and the gate electrode layer 260 is a layer of TiN having a thickness of 50 Å. In this case, the gate electrode of the NMOS transistor formed in the first region R1 includes TiN having a thickness of 50 Å, whereas the gate electrode of the PMOS transistor formed in the second region R2 has a stacked structure of TiN having a thickness of 50 Å and TaN having a thickness of 50 Å. From the graph of FIG. 4 it can be seen that the difference between flat band voltages of the first gate 270 in the first region R1 and the second gate 275 in the second region R2 is approximately 270 mV.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of fabricating a semiconductor device having a dual gate, the method comprising:

forming, sequentially, a gate insulation layer, a first capping layer, and a barrier layer each across NMOS and PMOS regions on a substrate;

removing the first capping layer and the barrier layer from the NMOS region to expose the gate insulation layer in the NMOS region;

forming a second capping layer on the gate insulation layer in the NMOS region and on the barrier layer in the PMOS region;

thermally processing the substrate while the barrier layer remains on the first capping layer in the PMOS region and the second capping layer remains on the barrier layer in the PMOS region and on the gate insulation layer in the NMOS region, such that material of the second capping layer spreads into the gate insulation layer in the NMOS region to form a NMOS gate insulation layer, and material of the first capping layer spreads into the gate insulation layer in the PMOS region to form a PMOS gate insulation layer, wherein the barrier layer is formed of material that prevents material of the second capping layer from spreading into the gate insulation layer in the PMOS region during the thermal processing;

removing the second capping layer from the PMOS region after the thermal processing of the substrate has been carried out;

forming a gate electrode layer on the NMOS gate insulation layer in the NMOS region and the barrier layer in the PMOS region;

etching the gate electrode layer and the NMOS gate insulation layer to form a first gate in the NMOS region; and etching the gate electrode layer, the barrier layer and the PMOS gate insulation layer to form a second gate in the PMOS region.

2. The method of claim 1, wherein the gate electrode layer comprises a metal or a metal alloy.

3. The method of claim 2, wherein the metal is selected from a group consisting of: titanium, tantalum, tungsten, hafnium and molybdenum.

4. The method of claim 1, wherein the second capping layer is formed of a material different from that of the first capping layer.

5. The method of claim 1, wherein each of the first capping layer and the second capping layer comprises at least one material selected from a group of materials consisting of: an aluminum oxide, a lanthanum oxide, a yttrium oxide, a dysprosium oxide, and a magnesium oxide.

6. The method of claim 5, wherein composition of the first capping layer is different from composition of the second capping layer.

7. The method of claim 1, wherein the gate insulation layer is formed of a high-k material.

8. The method of claim 7, wherein the gate insulation layer is formed of at least one material selected from a group of materials consisting of: a hafnium oxide, a hafnium silicon oxide, a hafnium oxynitride, a hafnium silicon oxynitride, a hafnium aluminum oxide, a hafnium lanthanum oxide, and a lanthanum oxide.

9. The method of claim 1, wherein the gate insulation layer comprises at least one dielectric material selected from a group consisting of: a silicon oxide, a silicon oxynitride, and a silicon nitride.

10. The method of claim 1, wherein the barrier layer comprises a metal or a metal alloy.

11. The method of claim 10, wherein the metal is selected from a group consisting of: titanium, tantalum, tungsten, hafnium and molybdenum.

12. The method of claim 1, wherein the forming of the gate insulation layer comprises continuously forming a layer of high-k dielectric material across the NMOS and PMOS regions.

* * * * *